(12) United States Patent
Masumoto

(10) Patent No.: US 11,037,845 B2
(45) Date of Patent: Jun. 15, 2021

(54) SEMICONDUCTOR DEVICE AND MANUFACTURING METHOD THEREOF

(71) Applicant: Mitsubishi Electric Corporation, Tokyo (JP)

(72) Inventor: Hiroyuki Masumoto, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 16/593,640

(22) Filed: Oct. 4, 2019

(65) Prior Publication Data

US 2020/0286799 A1 Sep. 10, 2020

(30) Foreign Application Priority Data

Mar. 6, 2019 (JP) .............................. JP2019-040646

(51) Int. Cl.
*H01L 23/04* (2006.01)
*H01L 23/31* (2006.01)
*H01L 23/10* (2006.01)
*H01L 23/00* (2006.01)

(52) U.S. Cl.
CPC ............ *H01L 23/041* (2013.01); *H01L 23/10* (2013.01); *H01L 23/3142* (2013.01); *H01L 24/85* (2013.01)

(58) Field of Classification Search
CPC ... H01L 23/041; H01L 23/10; H01L 23/3142; H01L 24/85; H01L 23/42
See application file for complete search history.

(56) References Cited

U.S. PATENT DOCUMENTS

| 5,646,445 | A | * | 7/1997 | Masumoto | ............... | H01L 23/24 |
| | | | | | | 257/703 |
| 2005/0161778 | A1 | * | 7/2005 | Morelle | ................ | H01L 25/072 |
| | | | | | | 257/678 |
| 2011/0272797 | A1 | * | 11/2011 | Onishi | ..................... | H01L 23/36 |
| | | | | | | 257/698 |

FOREIGN PATENT DOCUMENTS

JP H08070066 A 3/1996

* cited by examiner

*Primary Examiner* — Changhyun Yi
(74) *Attorney, Agent, or Firm* — Studebaker & Brackett PC

(57) ABSTRACT

A semiconductor device includes: a semiconductor chip; a case storing the semiconductor chip; a wire bonded to the semiconductor chip; a cover fixed inside the case and including a concave portion disposed above the semiconductor chip and the wire; and a sealing resin potted inside the case and sealing the semiconductor chip, the wire and the cover, wherein the sealing resin is not filled in the concave portion so that a cavity is provided.

18 Claims, 6 Drawing Sheets

SEMICONDUCTOR DEVICE AND MANUFACTURING METHOD THEREOF

BACKGROUND OF THE INVENTION

Field

The present invention is related to a semiconductor device and a manufacturing method thereof wherein a wire is bonded to a semiconductor chip and they are sealed with a sealing resin.

Background

Semiconductor devices are used in various situations such as power generation, power transmission, and efficient utilization and regeneration of energy. In the semiconductor device using an epoxy resin that is harder and has a higher Young's modulus than silicone gel as a sealing resin, there has been a problem that the reliability of the product is reduced by stress to the internal components such as a semiconductor chip. In contrast, there has been proposed a semiconductor device in which the semiconductor chip is sealed with a cover so that the resin is not filled in the cover (see, for example, Japanese Patent Laid-Open No. H8-70066)

SUMMARY

Generally the wire is bonded to the semiconductor chip. In the prior art, the semiconductor chip, the wire, and the circuit pattern are sealed with the cover. However, there has been a problem that discharge is generated by applying a high voltage to a place not resin-sealed in the cover during use of the semiconductor device and the reliability of the product is reduced.

The present invention is devised in order to solve the aforementioned problems, and an object thereof is to provide a semiconductor device and a manufacturing method thereof capable of improving the reliability of the product.

A semiconductor device according to the present invention includes: a semiconductor chip; a case storing the semiconductor chip; a wire bonded to the semiconductor chip; a cover fixed inside the case and including a concave portion disposed above the semiconductor chip and the wire; and a sealing resin potted inside the case and sealing the semiconductor chip, the wire and the cover, wherein the sealing resin is not filled in the concave portion so that a cavity is provided.

In the present invention, it is possible to prevent discharge by sealing a semiconductor chip and a wire with a sealing resin. Then, a cover having a concave portion is provided above the semiconductor chip and the wire. In the concave portion of the cover, the sealing resin is not filled and the cavity is provided. This cavity reduces the volume of the sealing resin around the semiconductor chip and the wire, and thus and the rigidity is reduced. Thereby, the stress applied to the internal components by the sealing resin can be reduced. As a result, it is possible to improve the reliability of the product.

Other and further objects, features and advantages of the invention will appear more fully from the following description.

DESCRIPTION OF EMBODIMENTS

A semiconductor device and a manufacturing method thereof according to the embodiments of the present invention will be described with reference to the drawings. The same components will be denoted by the same symbols, and the repeated description thereof may be omitted.

First Embodiment

Figure 1:
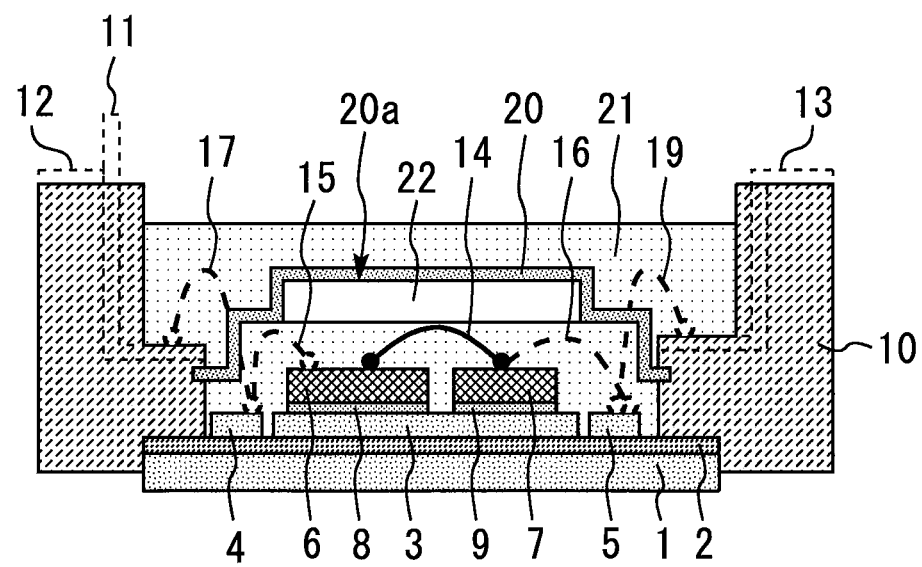
FIG. 1 is a cross-sectional view showing a semiconductor device according to a first embodiment.
Figure 2:
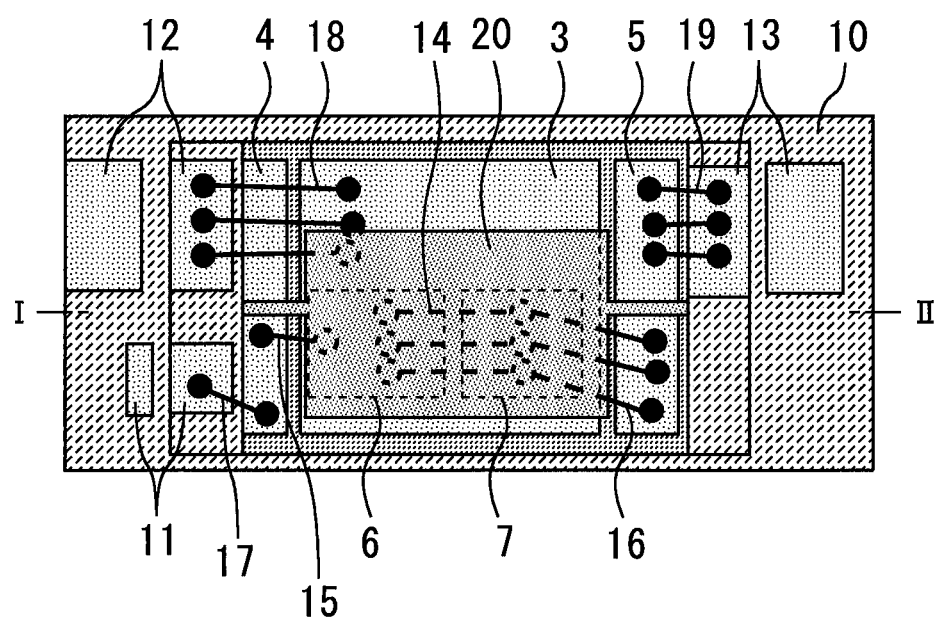
FIG. 2 is a plan view showing the interior of the semiconductor device according to the first embodiment.

FIG. 1 is a cross-sectional view showing a semiconductor device according to a first embodiment. FIG. 2 is a plan view showing the interior of the semiconductor device according to the first embodiment. FIG. 1 corresponds to a cross-section along I-II of FIG. 2.

An insulating layer 2 is provided on a base plate 1. Circuit patterns 3, 4, 5 are provided on the insulating layer 2. The base plate 1, the insulating layer 2, the circuit patterns 3, 4, 5 constitute a resin-insulated copper base plate. Instead of the resin-insulated copper base plate, it may be used a structure that combines the base plate and a ceramic substrate having a circuit pattern.

Semiconductor chips 6 and 7 are provided on the circuit pattern 3. The semiconductor chip 6 is an IGBT (Insulated Gate Bipolar Transistor), its lower electrode is a collector electrode, its upper electrode is an emitter electrode, and its control electrode is a gate electrode. The semiconductor chip 7 is a FWD (Free Wheel Diode), its lower electrode is a cathode electrode, and its upper electrode is an anode electrode. The lower electrodes of the semiconductor chips 6 and 7 are electrically connected to the circuit pattern 3 by solder 8 and 9, respectively. A case 10 is provided on the outer peripheral portion of the insulating layer 2 and accommodates the semiconductor chips 6 and 7. The case 10 has a signal terminal 11 and electrode terminals 12 and 13.

Wires 14 to 16 are bonded to the upper electrodes of the semiconductor chips 6 and 7. The upper electrodes of the semiconductor chips 6 and 7 are connected to each other by a wire 14. The control electrode and the circuit pattern 4 of the semiconductor chip 6 is connected by a wire 15. The upper electrode of the semiconductor chip 7 and the circuit pattern 5 are connected by a wire 16. The circuit pattern 4 and the signal terminal 11 are connected by a wire 17. The circuit pattern 3 and the electrode terminal 12 are connected by a wire 18. The circuit pattern 5 and the electrode terminal 13 are connected by a wire 19.

The cover 20 is fixed inside the case 10 so that the concave portion 20a of the cover 20 is disposed above the semiconductor chips 6 and 7 and the wires 14 to 16. The concave portion 20a is provided on the lower surface of the cover 20. A sealing resin 21 is potted inside the case 10 and seals the semiconductor chips 6 and 7, the wires 14 to 19 and the cover 20. The sealing resin 21 is, for example, an epoxy resin that is hard and has a high Young's modulus. The sealing resin 21 is not filled in the concave portion 20a, and a cavity 22 is provided. The material of the case 10 is PPS, PBT or the like, but is not limited thereto, and any material that does not have poor adhesion to the sealing resin 21 may be used.

Figure 3:
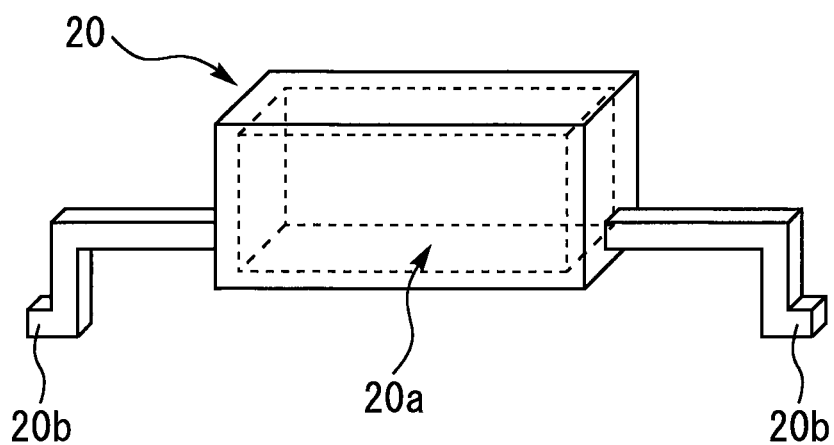
FIG. 3 is a perspective view showing a cover.
Figure 4:
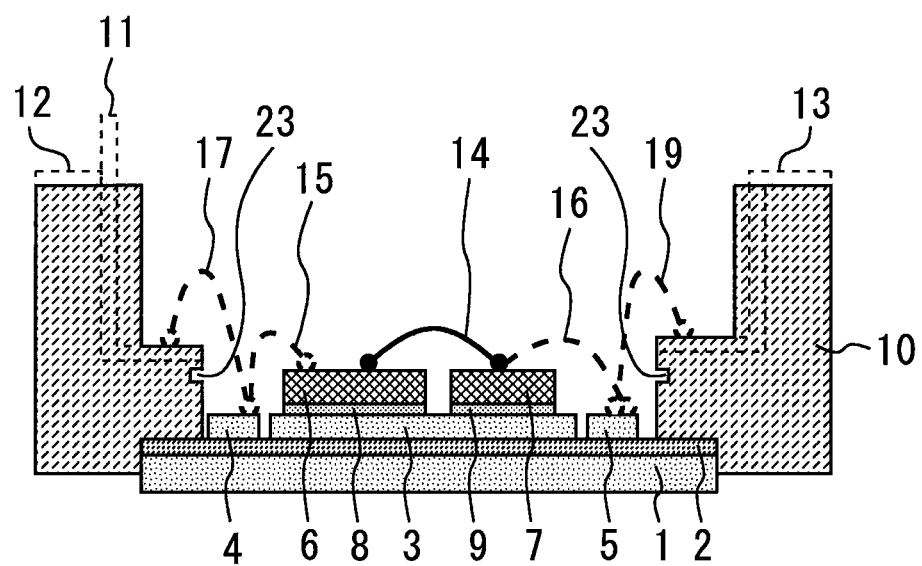
FIG. 4 is a cross-sectional view showing a semiconductor device before resin sealing.

FIG. 3 is a perspective view showing a cover. FIG. 4 is a cross-sectional view showing a semiconductor device before resin sealing. The cover 20 has a fitting portion 20b which can be fitted into the concave portion 23 of the inner side surface of the case 10. Thus, it is possible to easily fix the cover 20 by fitting the cover 20 to the case 10.

Figure 5:
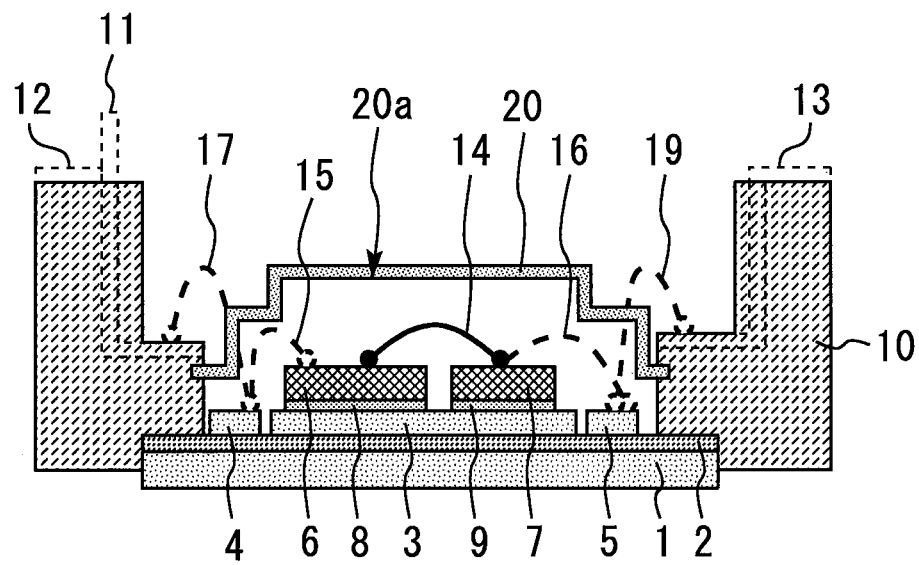
FIG. 5 is a cross-sectional view showing a method of manufacturing a semiconductor device according to the first embodiment.
Figure 6:
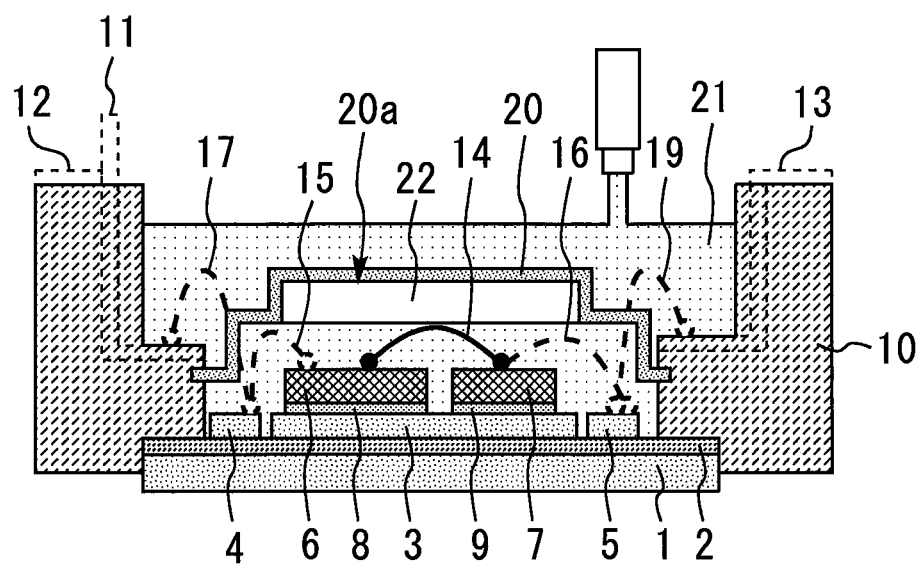
FIG. 6 is a cross-sectional view showing a method of manufacturing a semiconductor device according to the first embodiment.

FIGS. 5 and 6 are cross-sectional views showing a method of manufacturing a semiconductor device according to the first embodiment. First, the semiconductor chips 6 and 7 and the case 10 are mounted and wire bonding is performed. Next, as shown in FIG. 5, the cover 20 is fixed by fitting to the case 10.

Next, as shown in FIG. 6, the sealing resin 21 is potted inside the case 10. Air is trapped in the concave portion 20a of the cover 20 at this time and the cavity 22 is formed. Although the cover 20 receives buoyancy when the sealing resin 21 is filled, it is possible to prevent the floating by fixing the cover 20 to the case 10. If a thermosetting epoxy resin is used as the sealing resin 21, curing is performed after the filling, but the formed cavity 22 is maintained.

Figure 7:
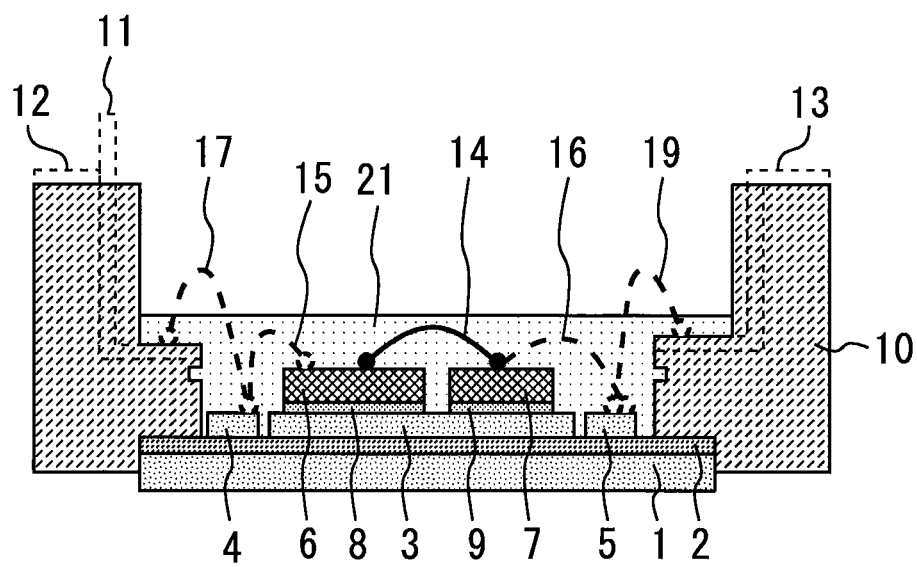
FIG. 7 is a cross-sectional view showing a modified example of a method of manufacturing a semiconductor device according to the first embodiment.
Figure 8:
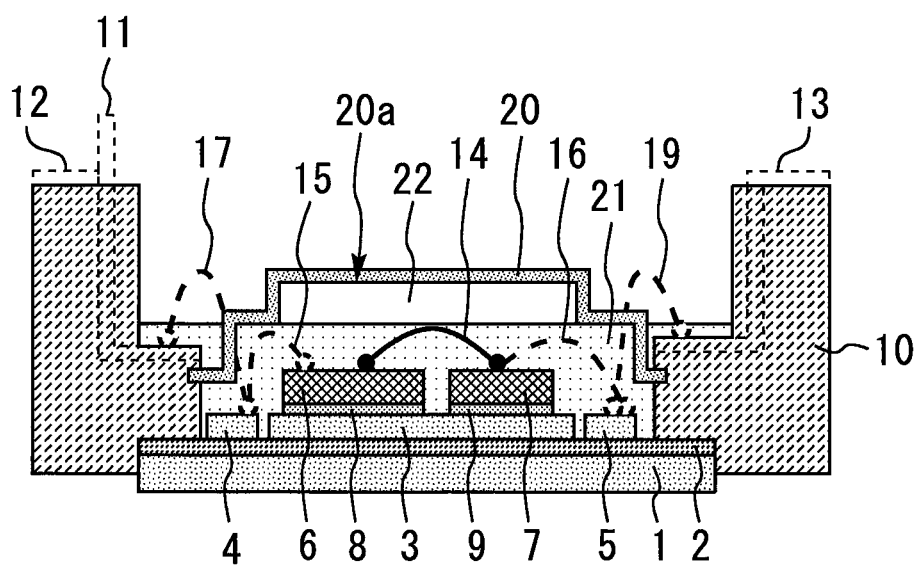
FIG. 8 is a cross-sectional view showing a modified example of a method of manufacturing a semiconductor device according to the first embodiment.

FIGS. 7 and 8 are cross-sectional views showing a modified example of a method of manufacturing a semiconductor device according to the first embodiment. As shown in FIG. 7, before attaching the cover 20, only a portion of the sealing resin 21 is potted to seal the semiconductor chips 6 and 7 and the wires 14 to 19. Since the curing is not performed at this time, the part of the sealing resin 21 is not cured. Next, as shown in FIG. 8, the cover 20 is fixed above the semiconductor chips 6 and 7 and the wires 14 to 16.

Next, as shown in FIG. 6, the cover 20 is sealed by repotting the rest of the sealing resin 21. Curing is performed after all the sealing resin 21 is potted. Since air can be easily trapped in the concave portion 20a of the cover 20 in the state of FIG. 8, the cavity 22 can be formed stably.

In this embodiment, it is possible to prevent discharge by sealing the semiconductor chips 6 and 7 and the wires 14 to 19 with the sealing resin 21. Note that a part of the wires 14 to 16 may enter the cavity 22 without being sealed. However, in order to prevent discharge, it is necessary to prevent the presence of conductors having different potentials in the same cavity 22.

Further, the cover 20 having the concave portion 20a is provided above the semiconductor chips 6 and 7 and the wires 14 to 16. The concave portion 20a of the cover 20 is not filled with the sealing resin 21, and the cavity 22 is provided. The cavity 22 reduces the volume of the sealing resin 21 around the semiconductor chips 6 and 7 and the wires 14 to 16, and thus the rigidity is reduced. Therefore, the stress applied to the internal components by the sealing resin 21 can be reduced. As a result, it is possible to improve the reliability of the product.

Second Embodiment

Figure 9:
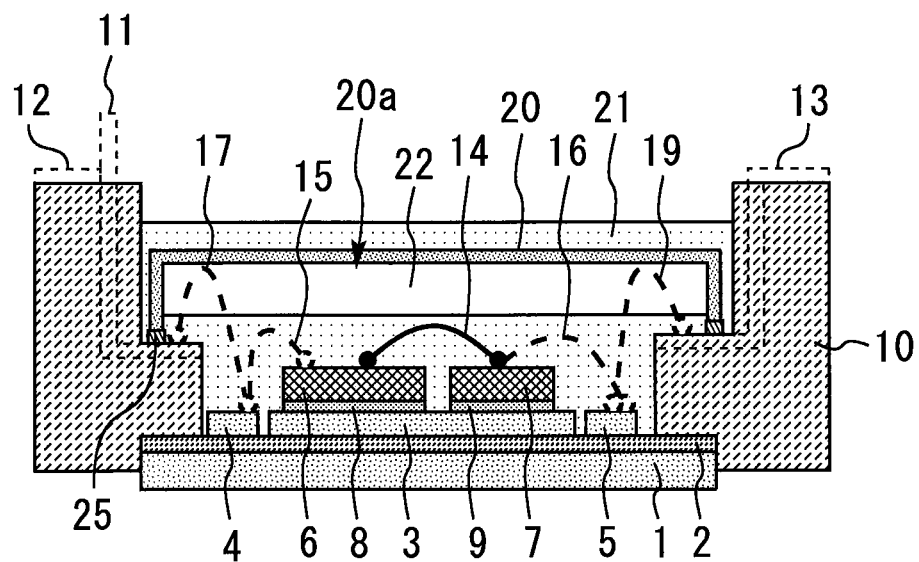
FIG. 9 is a cross-sectional view showing a semiconductor device according to a second embodiment.

FIG. 9 is a cross-sectional view showing a semiconductor device according to a second embodiment. The concave portion 23 of the case 10 and the fitting portion 20b of the cover 20 are omitted, and the cover 20 is attached to the case 10 with an adhesive 25 instead. Thereby, the design freedom of the case 10 and the cover 20 can be improved.

Other configurations and effects are the same as those of the first embodiment.

Third Embodiment

Figure 10:
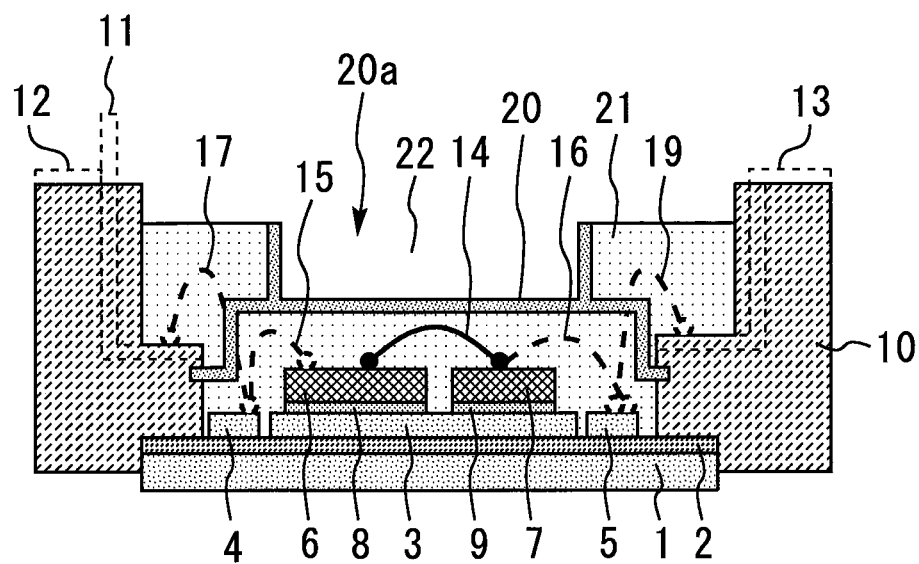
FIG. 10 is a cross-sectional view showing a semiconductor device according to a third embodiment.

FIG. 10 is a cross-sectional view showing a semiconductor device according to a third embodiment. A concave portion 20a is provided on the upper surface of the cover 20. Even in this case, the same effect as in the first embodiment can be obtained. However, since the cover 20 approaches the internal components such as the semiconductor chips 6 and 7, it is necessary to design such that the total value of the rigidity of the cover 20 and the sealing resin 21 above the internal components is lowered. For example, it is necessary to reduce the rigidity of the cover 20 by reducing the thickness of the cover 20 or selecting a material having a low Young's modulus.

Fourth Embodiment

Figure 11:
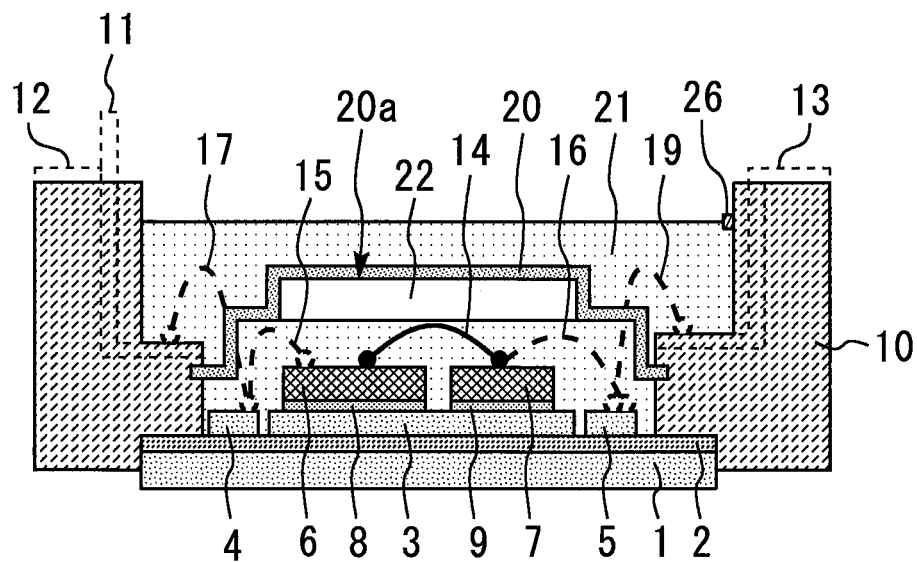
FIG. 11 is a cross-sectional view showing a method of manufacturing a semiconductor device according to a fourth embodiment.
Figure 12:
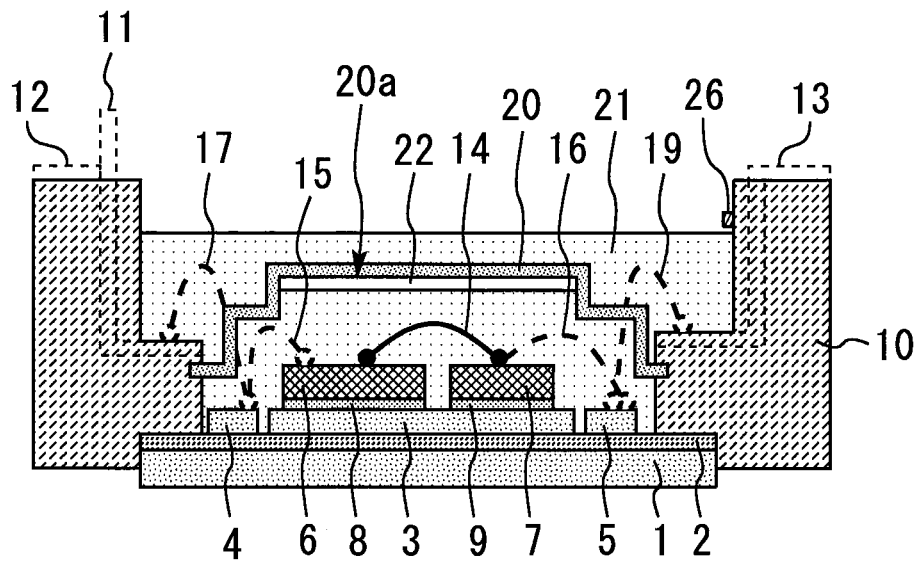
FIG. 12 is a cross-sectional view showing a method of manufacturing a semiconductor device according to a fourth embodiment.

FIGS. 11 and 12 are cross-sectional views showing a method of manufacturing a semiconductor device according to a fourth embodiment. As shown in FIG. 11, a height level reference line 26 is formed on the inner side surface of the case 10 at the height level of the sealing resin 21 when the cavity 22 can be formed as expected when all of the sealing resin 21 is potted. As shown in FIG. 12, when the sealing resin 21 enters the concave portion 20a of the cover 20 and the cavity 22 cannot be formed as expected, the height level of the sealing resin 21 becomes lower than the height level reference line 26.

Therefore, when all the sealing resin 21 is potted and the height level of the sealing resin 21 is lower than the height level reference line 26, forming failure of the cavity 22 is determined. Thus it is possible to easily determine the defective product.

The semiconductor chips 6 and 7 are not limited to chips formed of silicon, but instead may be formed of a wide-bandgap semiconductor having a bandgap wider than that of silicon. The wide-bandgap semiconductor is, for example, a silicon carbide, a gallium-nitride-based material, or diamond. Semiconductor chips formed by such a wide bandgap semiconductor, since the withstand voltage and the allowable current density is high, it can be miniaturized. The use of such miniaturized semiconductor chips enables the miniaturization and high integration of the semiconductor device in which the semiconductor chips are incorporated. Further, since the semiconductor chips have a high heat resistance, a radiation fin of a heatsink can be miniaturized and a water-cooled part can be air-cooled, which leads to further miniaturization of the semiconductor device. Further, since the semiconductor chips have a low power loss and a high efficiency, a highly efficient semiconductor device can be achieved.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2019-040646, filed on Mar. 6, 2019 including specification, claims, drawings and summary, on which the Convention priority of the present application is based, is incorporated herein by reference in its entirety.

The invention claimed is:

1. A semiconductor device comprising:
   a semiconductor chip positioned on a non-conducting surface of a base plate, the non-conducting surface having a first width;
   a case storing the semiconductor chip directly positioned on the non-conducting surface of the base plate;
   a wire bonded to the semiconductor chip;
   a cover fixed inside the case and including a concave portion disposed above the semiconductor chip and the wire, the concave portion having a second width that is less than the first width; and
   a sealing resin potted inside the case and sealing the semiconductor chip, the wire and the cover,
   wherein the sealing resin is not filled in the concave portion so that a cavity is provided.

2. The semiconductor device according to claim 1, wherein the concave portion is provided on a lower surface of the cover.

3. The semiconductor device according to claim 2, wherein the cover is fitted to the case.

4. The semiconductor device according to claim 2, wherein the cover is attached to the case with an adhesive.

5. The semiconductor device according to claim 2, wherein the semiconductor chip is made of a wide-band-gap semiconductor.

6. The semiconductor device according to claim 1, wherein the concave portion is provided on an upper surface of the cover.

7. The semiconductor device according to claim 6, wherein the cover is fitted to the case.

8. The semiconductor device according to claim 6, wherein the cover is attached to the case with an adhesive.

9. The semiconductor device according to claim 6, wherein the semiconductor chip is made of a wide-band-gap semiconductor.

10. The semiconductor device according to claim 1, wherein the cover is fitted to the case.

11. The semiconductor device according to claim 10, wherein the semiconductor chip is made of a wide-band-gap semiconductor.

12. The semiconductor device according to claim 1, wherein the cover is attached to the case with an adhesive.

13. The semiconductor device according to claim 12, wherein the semiconductor chip is made of a wide-band-gap semiconductor.

14. The semiconductor device according to claim 1, wherein the semiconductor chip is made of a wide-band-gap semiconductor.

15. A method of manufacturing a semiconductor device comprising:
    storing a semiconductor chip in a case, positioning the semiconductor chip on a non-conducting surface of a base plate, the base plate having a first width, and positioning the case directly on the non-conducting surface of the base plate;
    bonding a wire to the semiconductor chip;
    fixing a cover inside the case so that a concave portion of the cover is disposed above the semiconductor chip and the wire, the concave portion having a second width that is less than the first width; and
    potting a sealing resin inside the case to seal the semiconductor chip, the wire and the cover,
    wherein the sealing resin is not filled in the concave portion so that a cavity is provided.

16. The method of manufacturing a semiconductor device according to claim 15, comprising:
    potting only a portion of the sealing resin to seal the semiconductor chip and the wire;
    after potting the portion of the sealing resin, fixing the cover above the semiconductor chip and the wire; and
    potting a rest of the sealing resin to seal the cover.

17. The method of manufacturing a semiconductor device according to claim 16, wherein when all the sealing resin is potted and a height level of the sealing resin is lower than a height level reference line formed on an inner side surface of the case, forming failure of the cavity is determined.

18. The method of manufacturing a semiconductor device according to claim 15, wherein when all the sealing resin is potted and a height level of the sealing resin is lower than a height level reference line formed on an inner side surface of the case, forming failure of the cavity is determined.

* * * * *